United States Patent [19]

Chuang et al.

[11] Patent Number: 5,003,199
[45] Date of Patent: Mar. 26, 1991

[54] EMITTER COUPLED LOGIC CIRCUIT HAVING AN ACTIVE PULL-DOWN OUTPUT STAGE

[75] Inventors: Ching-Te K. Chuang, South Salem; Hyun J. Shin, Mahopac, both of N.Y.

[73] Assignee: International Business Machines Corp., Armonk, N.Y.

[21] Appl. No.: 484,949

[22] Filed: Feb. 26, 1990

[51] Int. Cl.⁵ .................... H03K 19/01; H03K 17/08
[52] U.S. Cl. .................................. 307/446; 307/455; 307/570
[58] Field of Search ............... 307/446, 455, 443, 570

[56] References Cited

U.S. PATENT DOCUMENTS

| | | | |
|---|---|---|---|
| 4,547,686 | 10/1985 | Chen | 307/570 |
| 4,713,560 | 12/1987 | Herndon | 307/455 |
| 4,847,522 | 7/1989 | Fuller et al. | 307/570 |

*Primary Examiner*—David Hudspeth
*Assistant Examiner*—Andrew Sanders
*Attorney, Agent, or Firm*—Pollock, Vande Sande & Priddy

[57] ABSTRACT

An ECL circuit having an output circuit with improved pull-down characteristics. An active pull-down circuit is provided by a p-channel JFET which includes a back gate connection or a merged p-channel JFET/NPN device. The gate and/or back gate are switched, providing a lowering of the device impedance during switching of the device from pull-up to pull-down operation, resulting in an improved pull-down speed.

6 Claims, 7 Drawing Sheets

FIG. 7

EMITTER COUPLED LOGIC CIRCUIT HAVING AN ACTIVE PULL-DOWN OUTPUT STAGE

The present invention relates to switching circuits implemented in NPN bipolar technology. Specifically, ECL circuits having improved speed and drive capability are described.

ECL logic circuits are used to implement high speed computing devices. The ECL (Emitter-Coupled-Logic) circuits are implemented in bipolar technology to benefit from the higher speed switching capability of bipolar transistors. The output stages of the circuits include a pull-up and pull-down circuit connected in tandem. The tandem connection of the pull-up and pull-down circuits will drive a load to a "1" logic level, or to a "0" logic level. These output circuits are therefore capable of establishing a logic 1 and logic 0 conditions for other circuits, at very high speeds, connected via a transmission line to the output circuit.

In implementing ECL circuits, it has been found that the pull-up circuit switches more rapidly than the pull-down circuit. Because of the impedance provided by the pull-down circuit, which is typically a resistor, the load potential is slow to discharge to the lower logic level, thereby slowing down the overall switching speed for the device. Improvement in the switching speed for the pull-down circuit represents a potential basis for improving the overall switching speed for such ECL devices.

SUMMARY OF THE INVENTION

It is an object of this invention to increase the overall switching speed of an emitter coupled logic circuit.

It is a specific object of this invention to provide for improved switching speed of an output pull-down circuit of an ECL circuit.

It is an additional specific object of this invention to provide circuit elements which are capable of implementing the pull-down function for an ECL circuit to rapidly discharge the potential of a connected load during switching of the pull-down device.

These and other objects of the invention are provided by a new ECL output circuit which employs a junction FET or gated diode for active pull-down of a connected load to a common potential. In carrying out the invention, use is made of a junction FET which may be implemented in any NPN bipolar technology. The junction FET is connected in tandem with a pull-up circuit. The junction FET has a back gate as well as a standard gate. The standard gate for the junction FET defines a depletion region between the source and drain, which can be modulated to increase or decrease the conductivity between the source and drain.

The back gate is provided to supply additional conduction path modulation between the source and drain, for further controlling the overall impedance of the device during switching.

In a preferred embodiment of the invention, the back gate of the junction FET is connected to the preceding logic stage to be switched with the gate connection. During switching of the output logic states from logic 1 to logic 0, the impedance of the pull-down device is initially lowered due to the modulation of the depletion region defined by the gate and the back gate connected to the N-well. The momentary lowering of the device impedance will increase the current flow from the source to drain, thus rapidly discharging the potential at the load connection.

In yet other embodiments of the invention, the pull-down circuit is implemented in NPN bipolar technology with a junction FET and a standard bipolar junction transistor. By connecting the two devices in a gated diode arrangement, wherein the base-collector connection of the bipolar transistor is gated to form a diode through the junction FET, further lowering of the discharge impedance for the load is presented. This merged device provides for increased speed without increasing the power consumption or overly decreasing the circuit density.

DESCRIPTION OF THE PREFERRED EMBODIMENTS

Figure 1A:
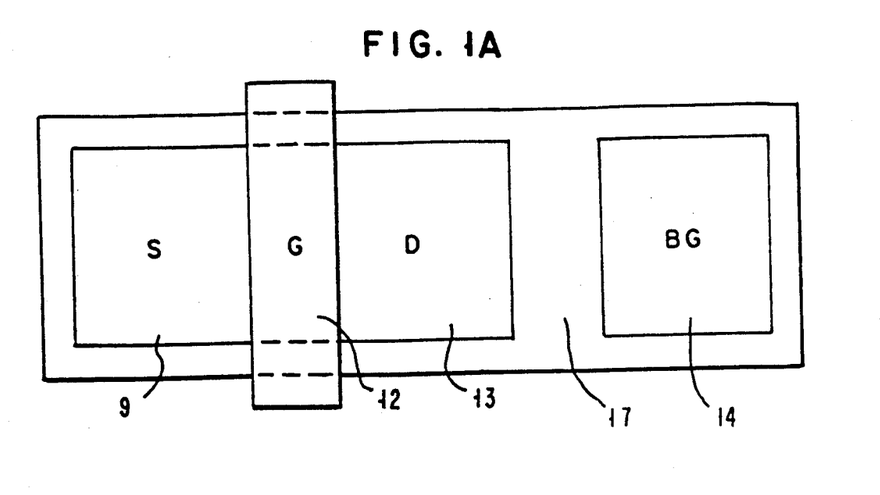
FIG. 1A is a top view of a P-channel junction field effect transistor (P-JFET) which includes a back gate 14.
Figure 1B:
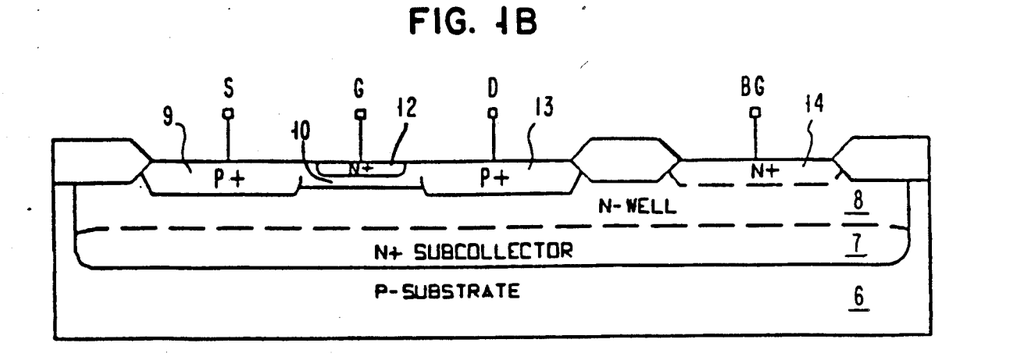
FIG. 1B is a cross-section of the P-JFET device shown in FIG. 1A.

Referring now to FIGS. 1A and 1B, there is shown a P-JFET structure which may be implemented in any bipolar technology. A conventional source 9, gate 12, and drain 13 structure is provided on a P-channel 10. The gate 12 comprising an N+ doped region is shown forming a junction with the P-channel 10, which, when biased appropriately with respect to the source, will control the amount of current flowing between the source and drain by modulating the width of the P-channel in the vicinity under the gate 12 electrode.

The drain 13 and source 9 are connected to the ends of the P-channel 10, as is known in junction FET devices.

The P-JFET of FIGS. 1A and 1B is also implemented with a back gate 14. The back gate 14 includes an N-well 8 extending along the underside of the P-channel 10 and connected to an implant 14 comprising the back gate. An N+ subcollector region 7 is shown separating the N-well 8 from the P-substrate 6 of the device.

Figure 1C:
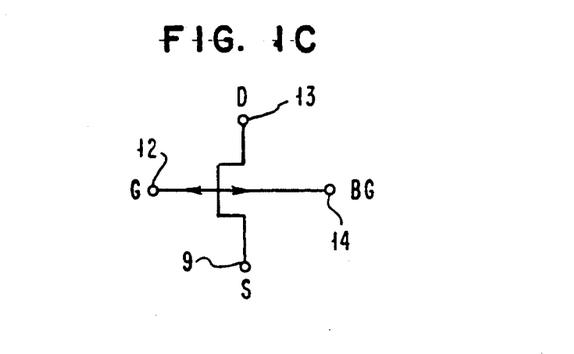
FIG. 1C schematically illustrates the structure of a P-JFET with a back gate.

FIG. 1C illustrates, in schematic form, the element resulting from the implementation of the P-JFET in accordance with the topography of FIGS. 1A and 1B. The back gate 14 and gate 12 both may be used to modulate the width of the P-channel 10, thus altering the current flow between the drain and source. The back gate 14, when appropriately biased with respect to the source 9, will control conduction from the source 9, and drain 13 by modulating the P-channel region 10 as well, based on the junction formed between the N-well 14 and P-channel 10.

The ability to modulate the P-channel using both the back gate 14 and gate 12 provides for increased current modulation capabilities between the drain 13 and source 9. The impedance provided between the drain 13 and source 9 is varied in response to the bias supply to the back gate, further giving the device a more controllable impedance between the drain 13 and source 9.

This ability to modulate the P-channel using both the back gate 14 and gate 12 is shown implemented as a pull-down circuit in FIGS. 2A through 5. Referring now to FIGS. 2A through 4B, there is shown a logic stage 25 of an ECL circuit connected to both a pull-up device 29, shown as a bipolar NPN transistor, and a pull-down device shown as the P-JFET 30 of FIGS. 1A and 1B. The difference between FIGS. 2A, 3A and 4A, and the corresponding illustrations of FIGS. 2B, 3B and 4B is the connection of the drain of each of the pull-down devices 30 to a lower potential in the case of the circuits of FIGS. 2B, 3B and 4B.

Figure 2A:
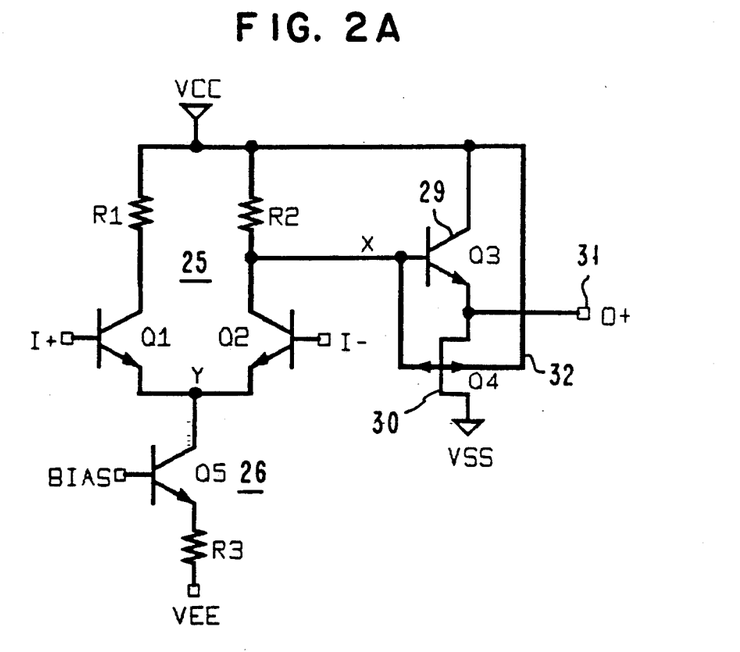
FIG. 2A shows an ECL circuit having a pull-down circuit in accordance with one embodiment of the invention.
Figure 2B:
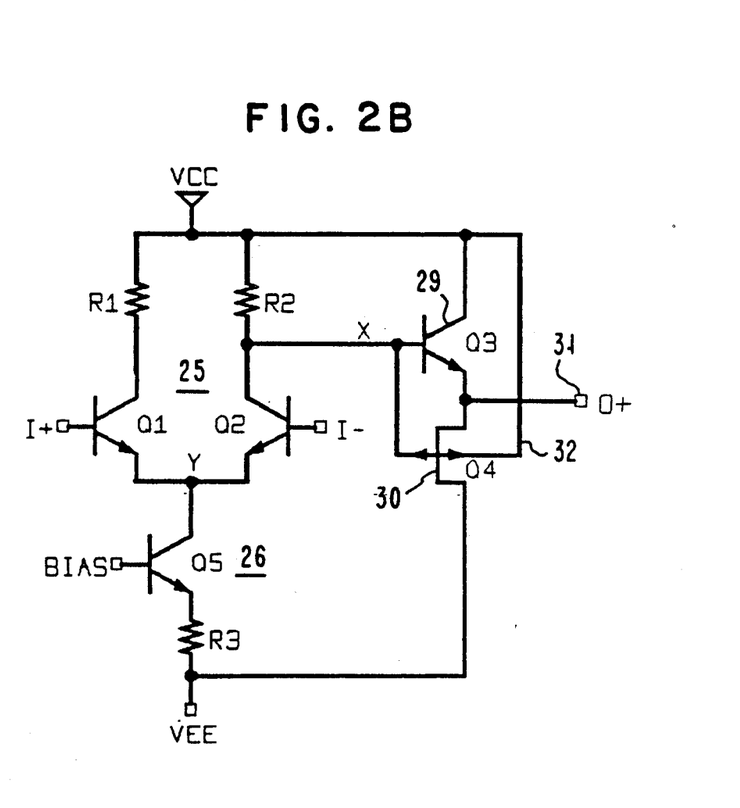
FIG. 2B shows the pull-down circuit of FIG. 2A implemented with a second type of ECL circuit having a lower pull-down potential.

FIGS. 2A and 2B illustrate the condition wherein the back gate 32 is tied to a potential VCC, providing a decrease in the width of the P-channel for the device.

FIGS. 3A, 3B, 4A and 4B take advantage of the ability to modulate the p-channel by switching the back gate 32 as well when the logic stage 25 switches.

Circuits described in these Figures make use of the fact that the gate potential for device 30 is higher than the source potential by VBE, i.e., the voltage drop across the base emitter junction for device 29 during steady states. During a pull-down transition, the potential on the base of device 29 and the gate of device 30 decreases. The gate for device 30 is therefore less reverse-biased than VBE volts with respect to the source. The impedance provided by device 30 during the initial pull-down mode will be effectively lower as the gate is less reverse-biased with respect to the source connection tied to the output terminal 31, and the load potential on terminal 31 discharges. The back gate 32 may additionally be appropriately biased such that it further lowers the drain-source impedance, further modulating the P-channel while increasing the pull-down speed of the device.

Figure 7:
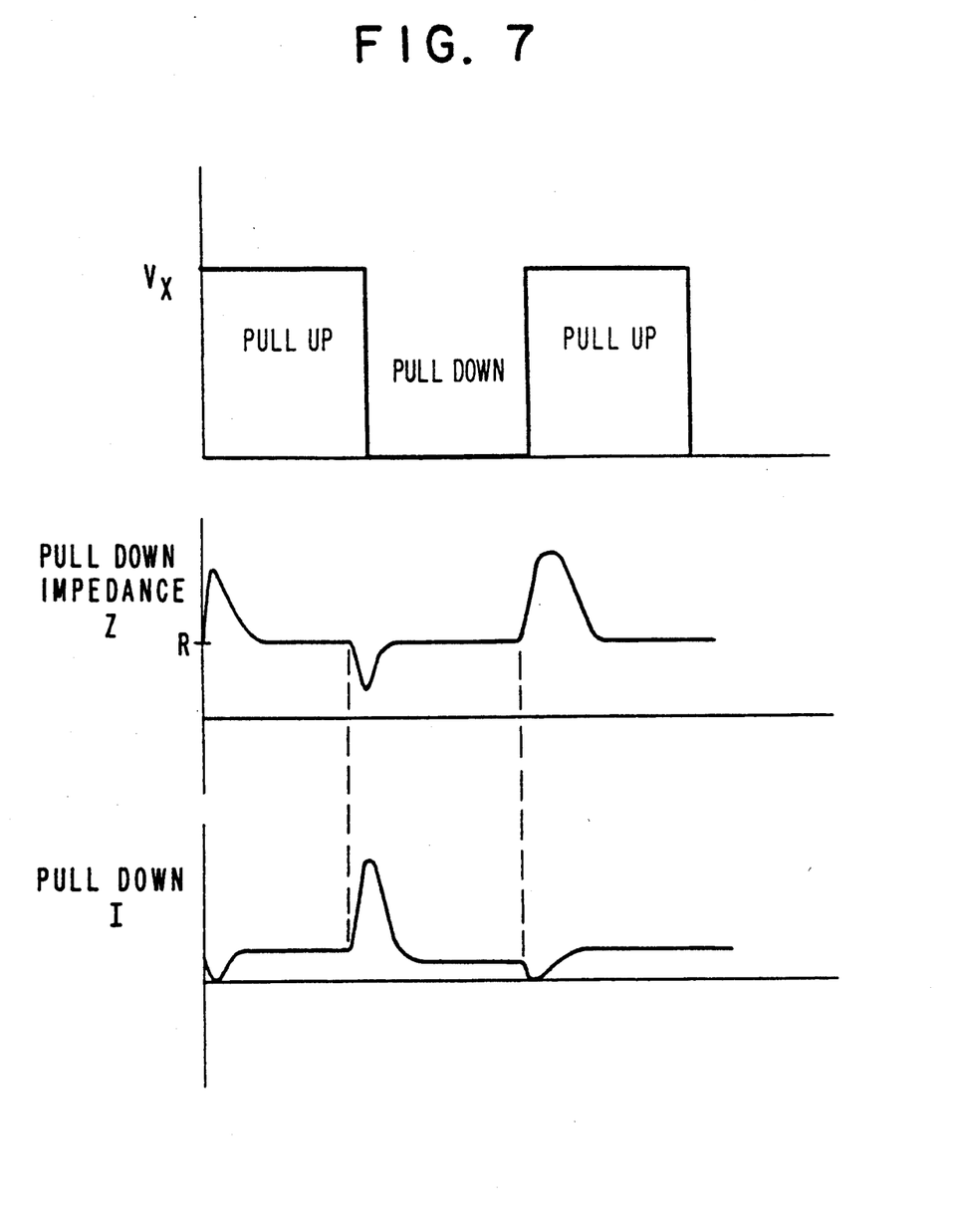
FIG. 7 illustrates the change in impedance and current for the pull-down circuits of the various embodiments.

The devices of FIGS. 3A, 3B, 4A and 4B modulate the back gate so as to provide a more dynamic impedance for the pull-down device 30, permitting the impedance to be initially lowered, rapidly discharging a load potential on terminal 31. As shown in FIG. 7, the potential at X driving the pull-up and pull-down device results in the impedance for the device 30, being lowered substantially during the initial pull-down mode, thereby increasing the discharging current. During the initial pull-up mode, the reverse occurs, and the impedance of the device initially rises, due to the modulation of the gate and back gate 32 for the device. During the steady states, the impedance of the device 30 is restored to a nominal value R, as illustrated in FIG. 7.

Figure 3A:
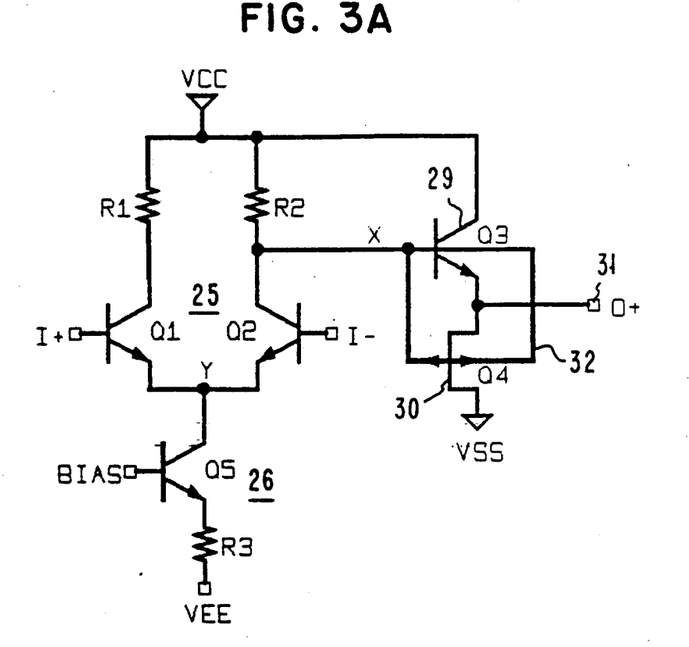
FIG. 3A illustrates a pull-down circuit having improved conductance modulation over the pull-down circuit of FIG. 2A.
Figure 3B:
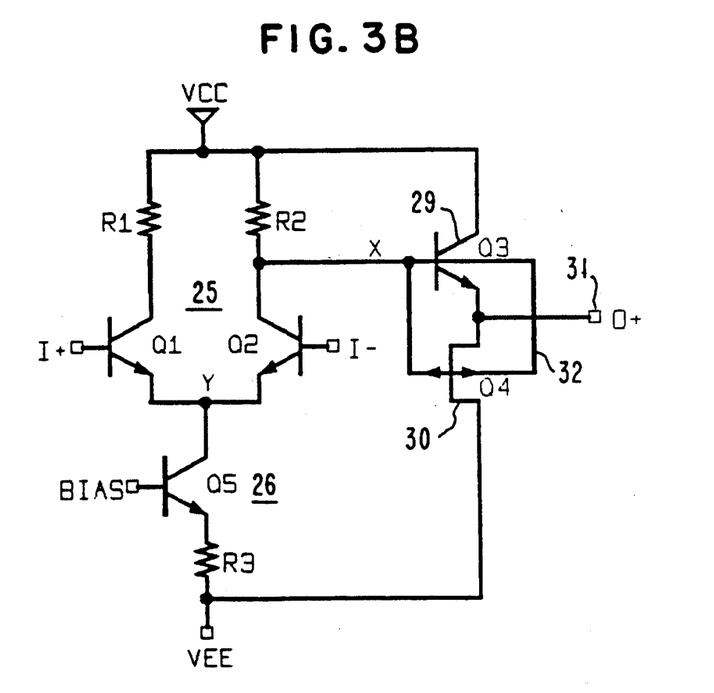
FIG. 3B demonstrates the pull-down circuit of FIG. 3A used with another ECL circuit having a lower pull-down potential.

The circuits of FIGS. 3A and 3B have the disadvantage of increasing the loading on node X which is driven from the ECL logic stage 25, which tends to increase the delay. This disadvantage of increased loading due to the back gate is compensated by the increase in speed which results from modulating the back gate of the device.

The effective resistance and degree of modulation depends on the connection of the gate and back gate of the device 30. As can be expected, the devices of FIGS. 3A, 3B, 4A and 4B provide more dynamic modulation of the P-channel resistance, given the modulation of the back gate 32, as well as the gate for the device 30.

The effect during the pull-down condition, as shown in FIG. 7, is to provide a transient decrease in pull-down impedance, thus quickly discharging any potential appearing at node 31. As the potential on terminal 31 decreases, the gate to source bias increases to VBE volts, thus permitting the device 30 impedance to increase to a level R reflecting the change in potential on terminal 31. During the subsequent pull-up condition, wherein device 29 is enabled into conduction, the gate potential for each of the devices 30 is rendered high, rapidly modulating the device impedance to essentially a non-conducting condition.

Figure 4A:
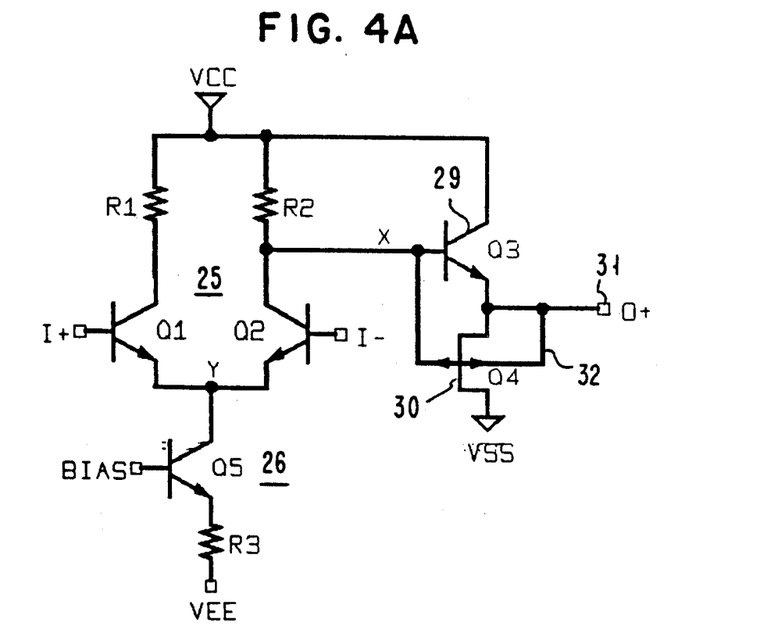
FIG. 4A illustrates a pull-down circuit in accordance with another embodiment of the invention.
Figure 4B:
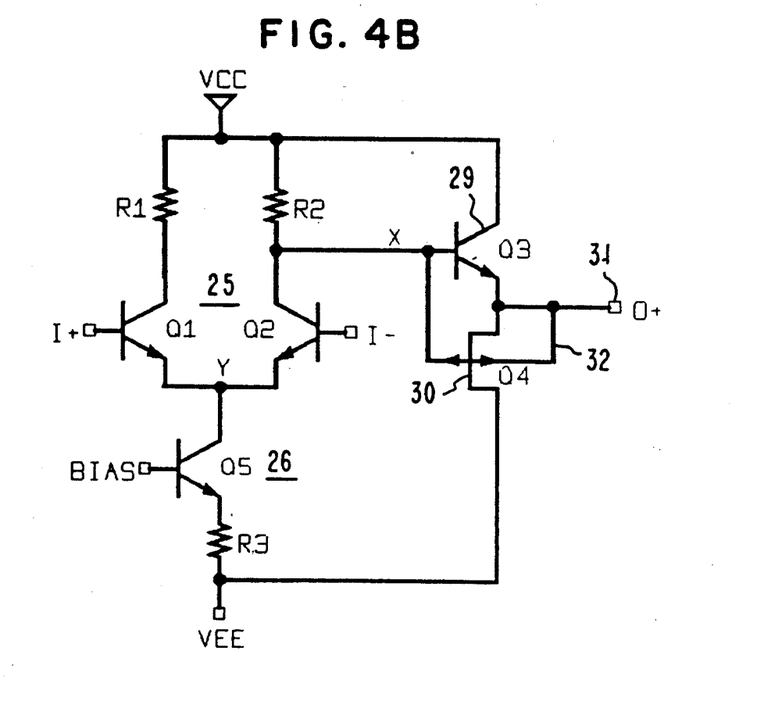
FIG. 4B shows the pull-down circuit of FIG. 4A used with a different driving ECL circuit having a lower pull-down potential.

The circuits of FIGS. 4A and 4B employ a connection of the back gate to the output terminal 31. This does not result in the degree of modulation obtained from connecting the back gate 32 directly to node X, but some improvement in loading on node X is realized. The back gate 32 which provides a capacitive load to its connected terminal is effectively isolated from node X by the pull-up device 29.

Figure 5:
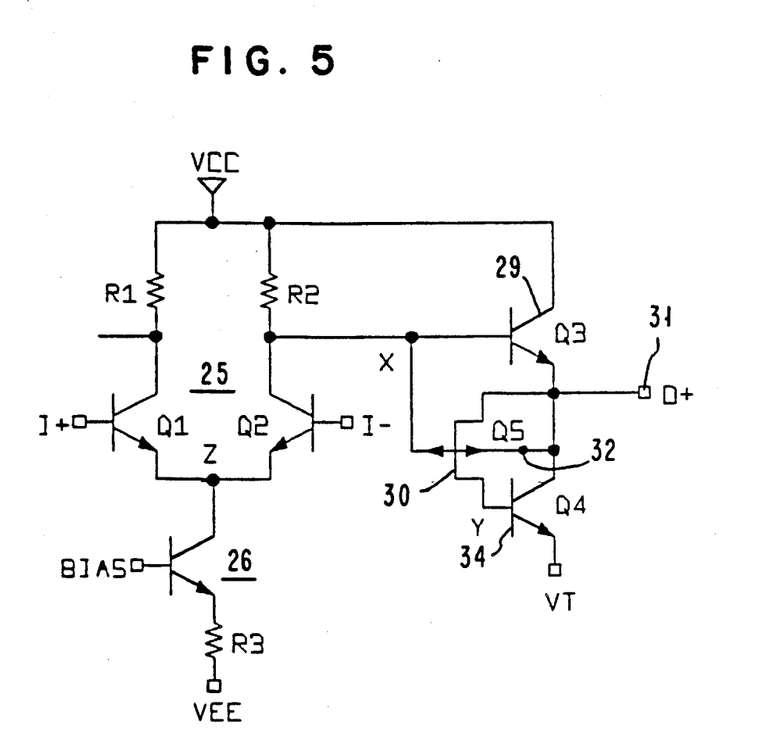
FIG. 5 shows a preferred embodiment of the invention wherein a pull-down circuit is provided having current gain over the previously described embodiments.

The foregoing principles may also be implemented to provide a pull-down circuit in accordance with FIG. 5. The pull-down circuit of FIG. 5 comprises two devices, a P-JFET 30 including a back gate 32, connected with an NPN device 34. The advantages realized by the additional NPN device 34 include additional current gain lowering even further the impedance during a pull-down mode between output terminal 31 and the terminal VT representing a pull-down potential. The combination of the P-JFET 30 and NPN transistor 34 results in a gated diode. In this embodiment, the back gate 32 is also connected to the output terminal 31, similar to FIGS. 4A and 4B. The gated diode resulting from this connection of P-JFET 30 and NPN device 34 provides an active resistor whose value changes dynamically following a signal transition on node X.

The advantages realized from the embodiment of FIG. 5 include the additional current gain realized through NPN device 34. As the pull-down current is $(\beta+1)$ times the base current for the NPN device 34, the effective pull-down resistance by the device 30 is $(\beta+1)$ times smaller than the prior single JFET devices of FIGS. 2A, 2B, 3A, 3B, 4A and 4B. This provides an opportunity to decrease the P-JFET 30 size, conserving not only the necessary area needed for the device, but a drastic reduction of the gate capacitance added to the node X.

In operation, when the signal at node X changes state from a high condition representing the pull-up condition to the pull-down state, wherein the pull-down circuit sinks current from the output terminal 31, the P-JFET 30 will have a large transient decrease in impedance, as in the other embodiments. This transient decrease in impedance is reflected as an increase in current conducted by NPN device 34, rapidly discharging any potential remaining on output terminal 31. When the circuit finally obtains steady state, wherein terminal 31 has been effectively discharged, the gate source bias for P-JFET 30 is essentially VBE, the base emitter potential of device 29. At this time, the P-JFET 30 is conducting a moderate level of current, and the drain current can be established by the source drain voltage. For proper operation, source to drain voltage and the base current for NPN device 34 must be greater than zero. This essentially requires that the output level on terminal 31 be greater than VT by VBE. If the potential VT is sufficiently low, the drain current of P-JFET 30 is saturated, and the steady state pull-down currents of P-JFET 30 and NPN device 34 are approximately equal.

Figure 6A:
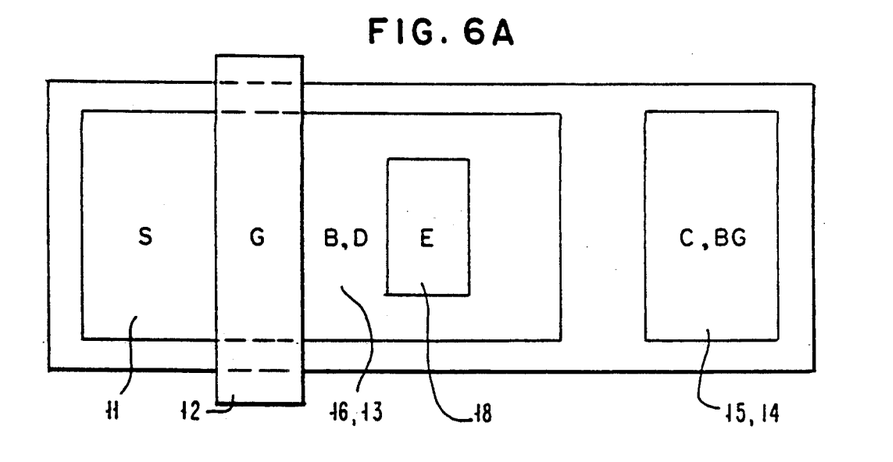
FIG. 6A illustrates how the pull-down circuit of FIG. 5 may be merged into a single P-JFET/NPN device.
Figure 6B:
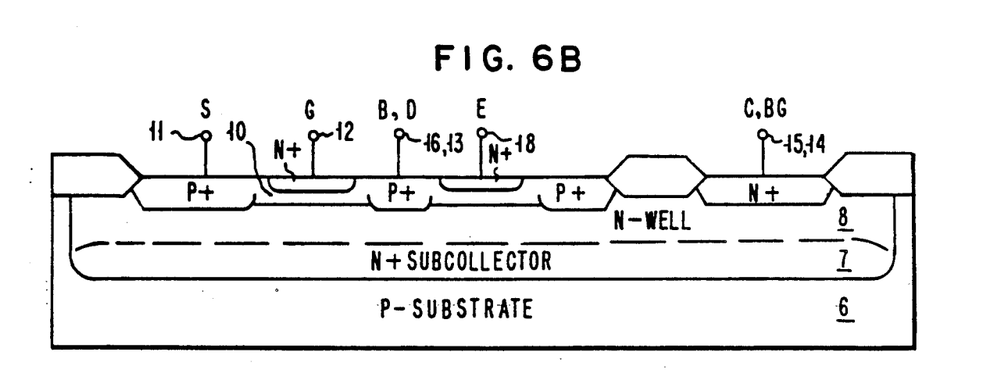
FIG. 6B is a cross-section of the merged P-JFET/NPN of FIG. 6A.
Figure 6C:
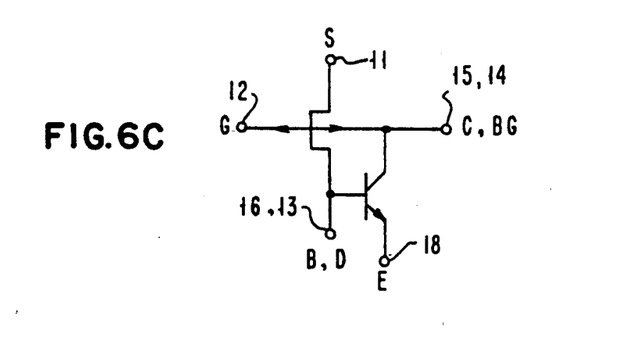
FIG. 6C schematically illustrates the resulting merged PJFET/NPN device.

A circuit element which can be used to realize the pull-down circuit of FIG. 5 is shown more particularly in FIGS. 6A and 6B. The device of FIGS. 6A and 6B can be viewed as a merged P-JFET/NPN device. In this device, an NPN bipolar transistor may be implemented with the P-JFET by disposing an emitter 18 along the P-channel 10. The emitter 18 forms a junction with the P-channel 10 in order that the drain connection 13 may also serve as a base connection 16 for the NPN device. The collector is common with the back gate 14, implemented through the N-well 8. The N-well 8 and P-channel 10 will provide the base collector junction for implementing the remaining half of the NPN device 34.

As was previously noted, advantage may be taken of the additional current gain provided by NPN device 34 while reducing the size of the J-PFET 30. Thus, the device of FIGS. 6A and 6B represents a saving in overall layout space for a pull-down circuit, and does not seriously burden the driving node X with a higher than desired load capacitance.

This merged device can be realized using any common NPN bipolar technology. The pull-down element will provide for the push-pull action that speeds up output transitions by varying the dynamic impedance without increasing the average power consumption.

Having thus described our invention, what we claim as new and desire to secure by Letters Patent is:

1. An emitter coupled logic circuit comprising:
   a bipolar transistor pull-up circuit having a base connected to a ECL logic stage circuit, and having an emitter-collector circuit connected to an output terminal and a power supply first terminal, providing a first voltage to said terminal in response to a first logic state applied from said logic stage;
   a junction field effect transistor pull-down circuit having a gate connected to said ECL logic stage circuit a source-drain circuit connected to said output terminal and a second terminal of said power supply, and a back gate connected to enable conduction of said source-drain circuit, whereby during switching of said logic stage circuit from a first logic state to a second logic state, said output terminal is connected through an impedance which initially decreases, and then increases as a load connected to said output terminal reaches a potential associated with said second logic state.

2. The emitter coupled logic circuit of claim 1 wherein said back gate is connected to said gate connection.

3. The emitter coupled logic circuit of claim 1 wherein said back gate is connected to said terminal.

4. An emitter coupled logic circuit for supplying a load with first and second logic levels comprising:
   a pull-up circuit connected to supply a first voltage level to said load in response to a first signal from an ECL logic stage;
   a pull-down circuit connected to supply a second voltage level to said load, comprising a junction field effect transistor connecting said load to a second voltage level in response to a second signal from said ECL logic stage, said junction field effect transistor having a back gate connected to a potential which increases current flow from said load through said junction field effect transistor in response to said second signal.

5. The emitter coupled logic circuit of claim 4 wherein said back gate is connected to said ECL logic stage, and receives said second signal which initially lowers said junction field effect transistor impedance during a transition period when said ECL logic circuit switches from providing said first signal to said second signal.

6. The emitter coupled logic circuit of claim 5 further comprising a bipolar transistor having a base emitter circuit connected in series with said junction field effect transistor drain, and a collector connected to said load, whereby said bipolar transistor decreases the impedance between the load and said second voltage level.

* * * * *